United States Patent
Inaba et al.

(10) Patent No.: US 11,920,256 B2
(45) Date of Patent: Mar. 5, 2024

(54) METHOD FOR GROWING RARE EARTH OXIDE CRYSTAL ON A SEMICONDUCTOR SUBSTRATE

(71) Applicant: Nippon Telegraph and Telephone Corporation, Tokyo (JP)

(72) Inventors: Tomohiro Inaba, Tokyo (JP); Takehiko Tawara, Tokyo (JP); Hiroo Omi, Tokyo (JP)

(73) Assignee: Nippon Telegraph and Telephone Corporation, Tokyo (JP)

(*) Notice: Subject to any disclaimer, the term of this patent is extended or adjusted under 35 U.S.C. 154(b) by 36 days.

(21) Appl. No.: 17/628,505

(22) PCT Filed: Aug. 5, 2019

(86) PCT No.: PCT/JP2019/030674
§ 371 (c)(1),
(2) Date: Jan. 19, 2022

(87) PCT Pub. No.: WO2021/024344
PCT Pub. Date: Feb. 11, 2021

(65) Prior Publication Data
US 2022/0259761 A1 Aug. 18, 2022

(51) Int. Cl.
C30B 25/18 (2006.01)
C23C 14/02 (2006.01)
(Continued)

(52) U.S. Cl.
CPC ............ C30B 25/18 (2013.01); C23C 14/021 (2013.01); C23C 14/08 (2013.01);
(Continued)

(58) Field of Classification Search
CPC ....... C30B 23/00; C30B 23/02; C30B 23/025; C30B 23/08; C30B 25/00; C30B 25/02;
(Continued)

(56) References Cited

U.S. PATENT DOCUMENTS

| 5,810,923 A | * | 9/1998 | Yano | H01L 21/02197 |
| | | | | 257/E21.271 |
| 8,679,953 B1 | * | 3/2014 | Clark | H01L 21/02192 |
| | | | | 257/E21.09 |

(Continued)

FOREIGN PATENT DOCUMENTS

| JP | H0691061 B2 | 11/1994 |
| JP | 2523380 B2 | 8/1996 |

OTHER PUBLICATIONS

Chikyow, T. et al., "Reaction and Regrowth Control of CeO2 on Si(111) Surface for the Silicon-On-Insulator Structure," Applied Physics Letters, vol. 65, No. 8, May 16, 1994, 4 pages.

(Continued)

*Primary Examiner* — Kenneth A Bratland, Jr.
(74) *Attorney, Agent, or Firm* — Slater Matsil, LLP

(57) ABSTRACT

In an embodiment method for growing a rare earth oxide crystal, a surface of a Si substrate is cleaned by carrying out treatments using chemical solutions such as a mixed sulfuric acid-hydrogen peroxide solution, hot nitric acid, or diluted hydrofluoric acid several times to remove impurities on the surface of the Si substrate. A silicon oxide layer including amorphous $SiO_x$ is formed on the Si substrate. A metal layer including a rare earth metal is formed in contact with an upper surface of the silicon oxide layer. The silicon oxide layer is reacted with the metal layer through heating to form a first crystal layer including a rare earth oxide crystal obtained by oxidizing the rare earth metal on the Si substrate.

15 Claims, 7 Drawing Sheets

(51) Int. Cl.
*C23C 14/08* (2006.01)
*C23C 16/02* (2006.01)
*C23C 16/40* (2006.01)
*C30B 29/16* (2006.01)

(52) U.S. Cl.
CPC ........ *C23C 16/0227* (2013.01); *C23C 16/401* (2013.01); *C30B 29/16* (2013.01)

(58) Field of Classification Search
CPC ....... C30B 25/16; C30B 25/18; C30B 25/183; C30B 25/186; C20B 29/00; C20B 29/10; C20B 29/16; C20B 29/22; C20B 29/30; C20B 29/32; C23C 14/00; C23C 14/0021; C23C 14/0036; C23C 14/02; C23C 14/021; C23C 14/022; C23C 14/024; C23C 14/025; C23C 14/08; C23C 14/083; C23C 14/24; C23C 14/34; C23C 16/00; C23C 16/02; C23C 16/0227; C23C 16/0272; C23C 16/40; C23C 16/401; C23C 16/402; C23C 16/405
USPC .................. 117/84, 88–90, 92, 94, 101, 103, 117/105–106, 108, 937, 944
See application file for complete search history.

(56) References Cited

U.S. PATENT DOCUMENTS

| | | | |
|---|---|---|---|
| 2004/0011280 A1* | 1/2004 | Higuchi | H01L 21/02557 257/E21.127 |
| 2005/0116266 A1* | 6/2005 | Hirano | H01L 29/517 438/711 |
| 2013/0334536 A1* | 12/2013 | Dargis | H01L 21/02381 257/76 |

OTHER PUBLICATIONS

Hillebrecht, F.U. et al., "Enhancement of Si Oxidation by Cerium Overlayers and Formation of Cerium Silicate," Physical Review B, vol. 34, No. 8, Oct. 15, 1986, 4 pages.

Ishizaka, A. et al., "Low Temperature Surface Cleaning of Silicon and Its Application to Silicon MBE," Journal of the Electrochemical Society: Electrochemical Science and Technology, vol. 133, No. 4, Apr. 1986, 6 pages.

\* cited by examiner

PRIOR ART

METHOD FOR GROWING RARE EARTH OXIDE CRYSTAL ON A SEMICONDUCTOR SUBSTRATE

This patent application is a national phase filing under section 371 of PCT application no. PCT/JP2019/030674, filed on Aug. 5, 2019, which application is hereby incorporated herein by reference.

TECHNICAL FIELD

The present invention relates to a method for growing a rare earth oxide crystal.

BACKGROUND

Quantum relay technology is indispensable for long-distance quantum cryptography communication. For practical use of quantum relay technology, it is important to reduce the sizes of devices and to realize an "on-chip photon memory". Erbium (Er)-doped rare earth oxide crystals have been attracting attention as an important material for realizing this technology. This is because Er operates with photons in the optical communication wavelength band and the transverse relaxation time T2 of Er is large.

In addition, high-quality lattice-matched crystals can grow with Si (111) and rare earth oxides, and a high photon-electron conversion efficiency can be expected by utilizing mature Si photonics technology. Therefore, technology of growing high-quality rare earth oxide crystals on a Si substrate is important to realize a highly efficient "on-chip photon memory".

In a case of growing rare earth oxide crystals on a Si substrate, cleanliness of the surface of the Si substrate affects the quality of the rare earth oxide crystals, and the quality of the crystals greatly affects the performance of devices. For this reason, various methods for cleaning a Si substrate have been reported (PTL 1 and 2, and NPL 1).

Hereinafter, the growth of rare earth oxide crystals on a Si substrate based on the technology of NPL 1 will be described with reference to FIGS. 7 and 8.

First, in Step S301, a surface of a Si substrate is cleaned by carrying out treatments using chemical solutions such as a mixed sulfuric acid-hydrogen peroxide solution, hot nitric acid, or diluted hydrofluoric acid several times to remove impurities on the surface of the Si substrate.

Next, in Step S302, the surface of the Si substrate is oxidized by chemical treatment using an oxidizing agent such as hydrogen peroxide to form an oxide layer including amorphous $SiO_x$ on the surface of the Si substrate.

Next, in Step S303, degassing on the surface of the oxide layer formed on the Si substrate is performed. A growth device that performs growing rare earth oxide crystals to be described below is used for the degassing of a Si substrate. A Si substrate is carried into a processing chamber of a growth device, the interior of the processing chamber is brought into a vacuum exhausted state, and the Si substrate is heated to about 500° C. to 600° C. This state can be maintained for several hours to perform degassing on the surface of an oxide layer.

After sufficiently performing removal of gas (degassing) attached onto the surface of an amorphous $SiO_x$ layer as described above, the oxide layer is removed through heating to clean the surface of the Si substrate in Step S304. For example, the temperature of the Si substrate can be increased to about 800° C. or higher in the processing chamber of the growth device to remove the amorphous $SiO_x$ layer on the surface of the Si substrate.

Next, in Step S305, the temperature of the Si substrate is set to a crystal growth temperature to start growing of the rare earth oxide crystals.

CITATION LIST

Patent Literature

[PTL 1] Japanese Patent No. 2523380
[PTL 2] JP H06-091061B

Non Patent Literature

[NPL 1] A. Ishizaka and Y. Shiraki, "Low Temperature Surface Cleaning of Silicon and Its Application to Silicon MBE", Journal of the Electrochemical Society, vol. 133, no. 4, pp. 666-671, 1986.
[NPL 2] F. U. Hillebrecht et al., "Enhancement of Si Oxidation by Cerium Overlayers and Formation of Cerium Silicate", Physical Review B, vol. 34, no. 8, pp. 5377-5380, 1986.
[NPL 3] T. Chikyow et al., "Reaction and Regrowth Control of CeO2 on Si(111) Surface for the Silicon-on-Insulator Structure", Applied Physics Letters, vol. 65, no. 8, pp. 1030-1032, 1994.

SUMMARY

Technical Problem

However, in the above-described growth of rare earth oxide crystals, there is a problem in that it takes a long time to grow rare earth oxide crystals in Step S305. In the above-described technology in the related art, it takes a few hours to degas and also time to remove an oxide layer.

Embodiments of the present invention can solve the above-described problems, and an object of embodiments of the present invention is to enable growth of rare earth oxide crystals on a Si substrate in a shorter time.

Means for Solving the Problem

A method for growing a rare earth oxide crystal according to embodiments of the present invention includes: a first step of forming an amorphous silicon oxide layer on a silicon substrate; a second step of forming a metal layer including a rare earth metal in contact with an upper surface of the silicon oxide layer; a third step of reacting the silicon oxide layer with the metal layer through heating to form a first crystal layer including a rare earth oxide crystal obtained by oxidizing the rare earth metal on the silicon substrate; and a fourth step of growing the rare earth oxide crystal on the first crystal layer to form a second crystal layer.

Effects of Embodiments of the Invention

As described above, according to embodiments of the present invention, since a metal layer including a rare earth metal is formed on a silicon oxide layer of an amorphous $SiO_x$ on a silicon substrate and these layers are reacted with each other to form a first crystal layer including a rare earth oxide crystal, the rare earth oxide crystal can grow on the Si substrate in a shorter time.

DETAILED DESCRIPTION OF ILLUSTRATIVE EMBODIMENTS

Figure 1:
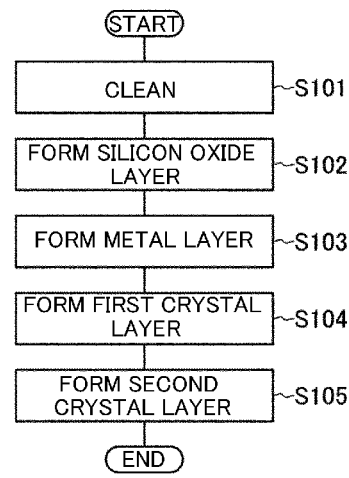
FIG. 1 is a flowchart for describing a method for growing a rare earth oxide crystal according to an embodiment of the present invention.
Figure 2:
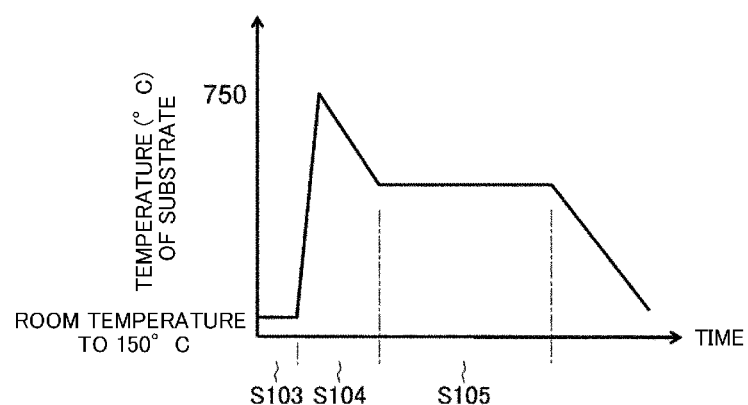
FIG. 2 is an explanatory view showing temperature change in a method for growing a rare earth oxide crystal according to an embodiment of the present invention.

Hereinafter, a method for growing a rare earth oxide crystal according to an embodiment of the present invention will be described with reference to FIGS. 1 and 2.

First, in Step S101, the surface of a Si substrate is cleaned by carrying out treatments using chemical solutions such as a mixed sulfuric acid-hydrogen peroxide solution, hot nitric acid, or diluted hydrofluoric acid several times to remove impurities on the surface of the Si substrate.

Next, in Step S102, a silicon oxide layer including amorphous $SiO_x$ is formed on the silicon (Si) substrate (first step). The silicon oxide layer is formed so as to cover the surface of the Si substrate. For example, the surface of the Si substrate is oxidized, and a silicon oxide layer including amorphous $SiO_x$ is formed on the surface of the Si substrate. The oxidation of the surface of the Si substrate can be carried out through a chemical treatment using, for example, hydrogen peroxide, nitric acid, sulfuric acid, and an oxidizing agent obtained by mixing these with hydrochloric acid. In addition, $SiO_x$ can be deposited through a well-known vacuum vapor deposition method or sputtering method to form an amorphous silicon oxide layer on the surface of the Si substrate.

Next, in Step S103, a metal layer including a rare earth metal is formed in contact with an upper surface of the silicon oxide layer (second step). For example, a metal layer including a rare earth metal can be formed through a well-known vapor deposition method in which a vapor deposition source including a rare earth metal is heated through ion bombardment heating. The temperature condition of the substrate when forming a metal layer through this vapor deposition method can be set to, for example, any temperature in the range of 20° C. to 150° C. In addition, a metal layer including a rare earth metal can also be formed through a sputtering method in which a target including a rare earth metal is used.

Next, in Step S104, the silicon oxide layer is reacted with the metal layer through heating to form a first crystal layer including a rare earth oxide crystal obtained by oxidizing the rare earth metal on the Si substrate (third step). For example, the silicon oxide layer is reacted with the metal layer through heating in a vacuum-exhausted state in a processing chamber of a vapor deposition device, in which the metal layer is formed through a vapor deposition method, to form a first crystal layer. The heating temperature in the formation of the first crystal layer can be set to, for example, 750° C.

This heating temperature can be appropriately set by obtaining a temperature at which a rare earth metal to be used reacts with silicon oxide for oxidation. Here, since it is important that the entirety of the metal layer is oxidized, the thickness of the metal layer formed in Step S103 (second step) is appropriately set so that the entirety of the metal layer is oxidized through the processing of Step S104 (third step).

Next, in Step S105, a rare earth oxide crystal is grown on the first crystal layer to form a second crystal layer (fourth step). For example, a second crystal layer can be formed through vapor deposition in an oxidizing atmosphere using a rare earth metal as a vapor deposition source. For example, a second crystal layer can grow on the first crystal by heating a vapor deposition source including a rare earth metal through ion bombardment heating in a state where an oxidizing agent such as oxygen radicals or ozone is supplied into a processing chamber of a vapor deposition device in which a metal layer is formed through a vapor deposition method. The temperature condition of the substrate when forming a second crystal layer through this vapor deposition method can be set to, for example, any temperature in the range of 100° C. to 1,000° C.

According to the above-described embodiment, since a degassing step is not required, a rare earth oxide crystal can grow on the Si substrate in a shorter time. In addition, according to the above-described embodiment, since there is no step of removing a silicon oxide layer (oxide layer) and the time over which the temperature is increased to remove a silicon oxide layer is shortened, a rare earth oxide crystal can grow on the Si substrate in a shorter time.

In addition, at a stage of the crystal growth of the second crystal layer in an oxidizing atmosphere, the surface of the Si substrate is covered with the first crystal layer. Therefore, oxidation of the surface of the Si substrate can be suppressed and the crystallinity of the second crystal layer improves. In the case where a rare earth oxide is grown in an oxidizing atmosphere, a $SiO_x$ layer is formed again on the surface of the cleaned Si substrate. As a result, there is a concern that an unnecessary interface layer (oxide layer) will be formed between the Si substrate and the rare earth oxide. Although a detailed mechanism of this interface layer has not yet been elucidated, it has been reported that an oxide layer is formed at an interface during growth of a rare earth oxide on an Si substrate (NPL 2 and 3). If an oxide layer is formed in this manner, there is a concern that crystallinity of a rare earth oxide thereon will deteriorate. However, according to the embodiments, the formation of the above-described oxide layer can be suppressed.

EXAMPLE

Hereinafter, a more detailed description will be given with reference to an example. In the example, a result of growing a gadolinium oxide ($Gd_2O_3$) crystal as a rare earth oxide using gadolinium (Gd) as a rare earth metal is shown. Rare earth elements have similar chemical properties because these have the same number of outermost electrons, and the same results can be expected even in a case where other rare earth metals are used.

First, a Si substrate of single-crystal Si having a plane orientation of the main surface of (111) is prepared, cleaning of the Si substrate as in Step S101 described above is performed, and an amorphous $SiO_x$ layer is formed on the surface of the Si substrate in the processing of Step S102.

Next, the Si substrate is carried into a processing chamber of a vapor deposition device, and the processing chamber is decompressed to a predetermined degree of vacuum. In this state, a Gd layer is formed on the $SiO_x$ layer through a vapor deposition method in which a vapor deposition source including Gd is heated through ion bombardment heating. The temperature condition of the substrate when forming a Gd layer through this vapor deposition method was set to, for example, 100° C. Here, four samples of a Gd layer with a thickness of 0.3 nm, a Gd layer with a thickness of 0.5 nm, a Gd layer with a thickness of 0.75 nm, and a Gd layer with a thickness of 1 nm were formed.

Next, the ion bombardment heating to each vapor deposition source of each sample was stopped in the same processing chamber, the pressure in the processing chamber was adjusted to about $5\times10^{-7}$ Pa, the temperature of each substrate was raised to 750° C. and held for 5 minutes, and Gd metal of each Gd layer reacted with each amorphous $SiO_x$ layer to form a first crystal layer. The reaction time was set to 1 minute or 5 minutes.

Thereafter, Gd metal was supplied by heating each vapor deposition source including Gd through ion bombardment heating in a state where the temperature of each substrate was maintained at 750° C. and oxygen radicals were supplied in the same processing chamber to grow $Gd_2O_3$ having a thickness of 40 nm.

Figure 3A:
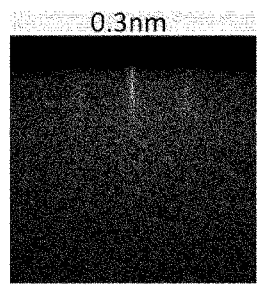
FIG. 3A is a RHEED image of a first crystal layer including $Gd_2O_3$ which has been actually produced and has a thickness of 0.3 nm.
Figure 3B:
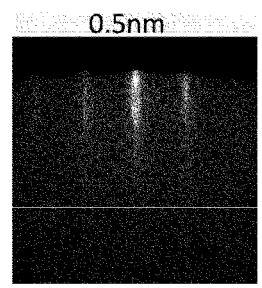
FIG. 3B is a RHEED image of a first crystal layer including $Gd_2O_3$ which has been actually produced and has a thickness of 0.5 nm.
Figure 3C:
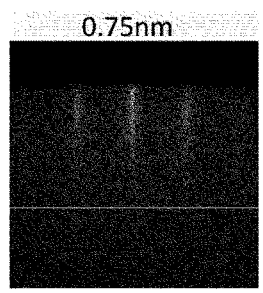
FIG. 3C is a RHEED image of a first crystal layer including $Gd_2O_3$ which has been actually produced and has a thickness of 0.75 nm.
Figure 3D:
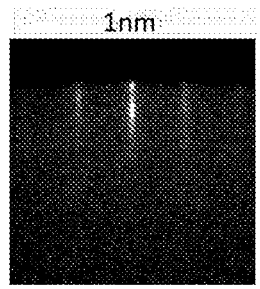
FIG. 3D is a RHEED image of a first crystal layer including $Gd_2O_3$ which has been actually produced and has a thickness of 1 nm.
Figure 3E:
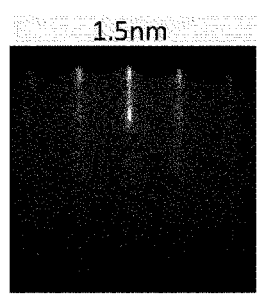
FIG. 3E is a RHEED image of a first crystal layer including $Gd_2O_3$ which has been actually produced and has a thickness of 1.5 nm.

Here, RHEED images of first crystal layers of the samples which were actually produced are shown in FIGS. 3A to 3E. In the samples in which the Gd layers have a thickness of 0.3 nm, 0.5 nm, 0.75 nm, and 1 nm, the RHEED images have a streak pattern, and it can be seen that the Gd layers reacted with the amorphous $SiO_x$ layers through heat treatment and the first crystal layers became a flat growth including $Gd_2O_3$ in two dimensions. On the other hand, in the sample in which the Gd layer has a thickness of 1.5 nm, the RHEED image became a little spotty as well as having a streak pattern as shown in FIG. 3E. Therefore, it became clear that $Gd_2O_3$ grew three-dimensionally.

Figure 4A:
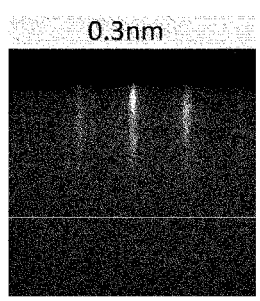
FIG. 4A is a RHEED image in a state where a $Gd_2O_3$ crystal having a thickness of 40 nm is grown on a first crystal layer including $Gd_2O_3$ which has been actually produced and has a thickness of 0.3 nm.
Figure 4B:
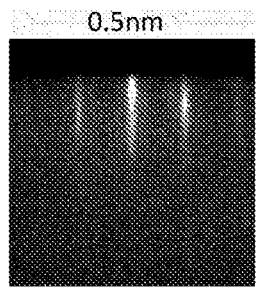
FIG. 4B is a RHEED image in a state where a $Gd_2O_3$ crystal having a thickness of 40 nm is grown on a first crystal layer including $Gd_2O_3$ which has been actually produced and has a thickness of 0.5 nm.
Figure 4C:
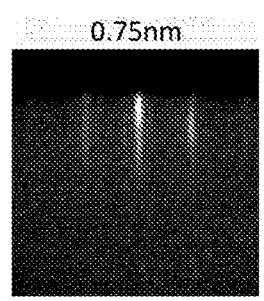
FIG. 4C is a RHEED image in a state where a $Gd_2O_3$ crystal having a thickness of 40 nm is grown on a first crystal layer including $Gd_2O_3$ which has been actually produced and has a thickness of 0.75 nm.
Figure 4D:
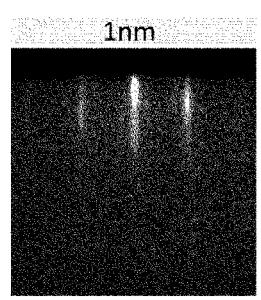
FIG. 4D is a RHEED image in a state where a $Gd_2O_3$ crystal having a thickness of 40 nm is grown on a first crystal layer including $Gd_2O_3$ which has been actually produced and has a thickness of 1 nm.
Figure 4E:
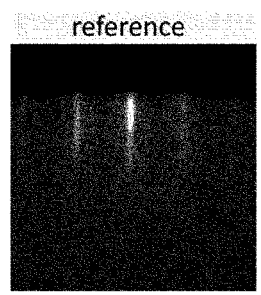
FIG. 4E is a RHEED image in a state where a $Gd_2O_3$ crystal having a thickness of 40 nm is grown through technology in the related art.

Next, RHEED images in a state where second crystal layers were produced in the samples which were actually produced are shown in FIGS. 4A to 4D. In addition, an RHEED image of $Gd_2O_3$ grown through technology in the related art is shown in FIG. 4E for reference. Since the RHEED images of the samples having any thickness of a Gd layer had a streak pattern similar to the reference sample, it was found that two-dimensionally flat $Gd_2O_3$ crystals can grow through the growth method according to embodiments of the present invention.

Figure 5:
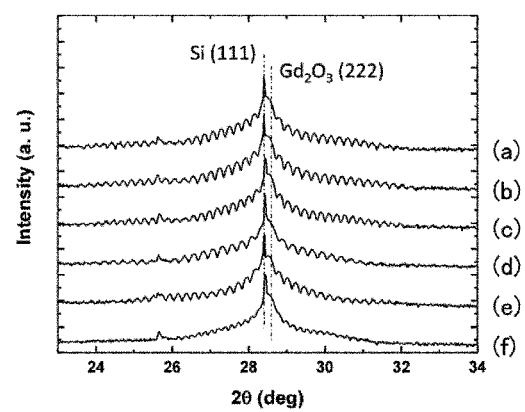
FIG. 5 is a characteristics diagram showing results obtained by 2θ-θ scan X-ray diffraction measurement for an actually produced sample.

Results obtained by 2θ-θ scan X-ray diffraction for each sample having the RHEED images in FIGS. 4A to 4E are shown in FIG. 5. Line (a) of FIG. 5 shows measurement results of the sample in which the Gd layer had a thickness of 1 nm and a first crystal layer was formed at a reaction time of 5 minutes. Line (b) of FIG. 5 shows a measurement result of the sample in which the Gd layer had a thickness of 0.75 nm and a first crystal layer was formed at a reaction time of 5 minutes. Line (c) of FIG. 5 shows a measurement result of the sample in which the Gd layer had a thickness of 0.75 nm and a first crystal layer was formed at a reaction time of 1 minute. Line (d) of FIG. 5 shows a measurement result of the sample in which the Gd layer had a thickness of 0.5 nm and a first crystal layer was formed at a reaction time of 5 minutes. Line (e) of FIG. 5 shows a measurement result of the sample in which the Gd layer had a thickness of 0.3 nm and a first crystal layer was formed at a reaction time of 5 minutes. Line (f) of FIG. 5 shows a measurement result of the reference sample of $Gd_2O_3$ grown through technology in the related art.

Since clear satellite peaks were confirmed in all the samples, it became clear that a $Gd_2O_3$/Si (111) interface was steep. However, since higher peaks were confirmed in the case where the growth method according to embodiments of the present invention was used, it was found that the crystallinity of $Gd_2O_3$ can be improved by the novel growth method.

Figure 6:
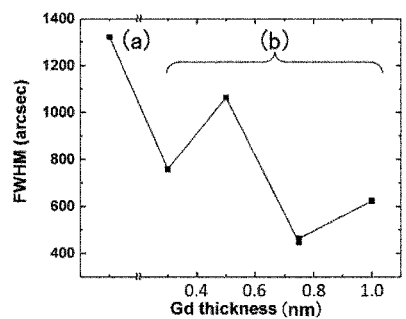
FIG. 6 is a characteristic diagram showing the dependence of a half-value width (FWHM) on a thickness of a Gd layer in ω scan X-ray diffraction measurement.
Figure 7:
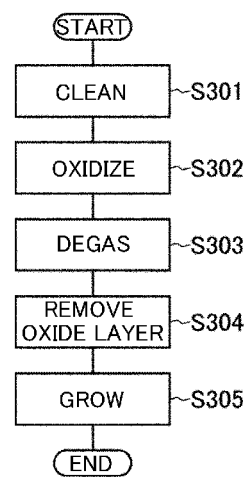
FIG. 7 is a flowchart for describing a method for growing a rare earth oxide crystal in the related art.
Figure 8:
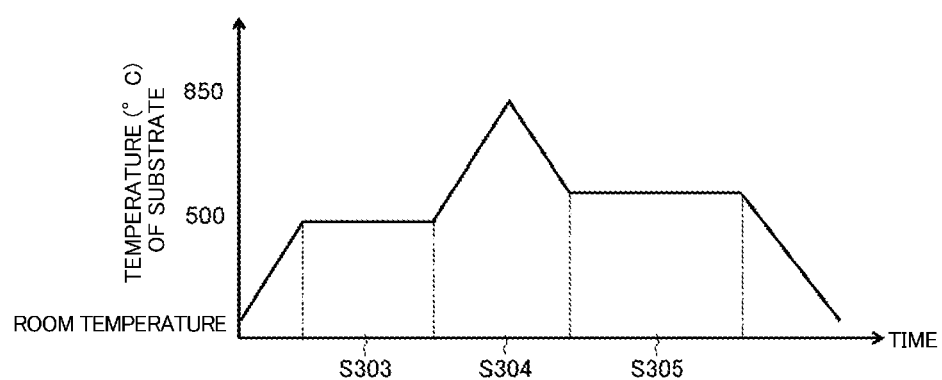
FIG. 8 is an explanatory view showing temperature change in the method for growing a rare earth oxide crystal in the related art.

Next, results obtained by ω scan X-ray diffraction measurement on a $Gd_2O_3$ (444) plane of each sample showing the RHEED images in FIGS. 4A to 4E are shown in FIG. 6. In FIG. 6, the dependence of a half-value width (FWHM) on a thickness of a Gd layer in the ω scan X-ray diffraction measurement is shown. Since it is difficult to separate a $Gd_2O_3$ (222) plane from a diffraction peak of the Si (111) plane, the $Gd_2O_3$ (444) plane which is a higher-order plane was used for the measurement. As shown in section (b) of FIG. 6, the measurement results (FWHM) of the samples produced through the growth method according to embodiments of the present invention are smaller than the measurement result (FWHM) of the reference sample shown in section (a) of FIG. 6.

In addition, FWHM was at a minimum when the Gd layer had a thickness of 0.75 nm. From these results, it was confirmed that the growth method according to embodiments of the present invention was effective for improving the quality of $Gd_2O_3$ crystals.

As described above, according to embodiments of the present invention, since a metal layer including a rare earth metal is formed on a silicon oxide layer of an amorphous $SiO_x$ on a silicon substrate and these layers are reacted with each other to form a first crystal layer including a rare earth oxide crystal, the rare earth oxide crystal can grow on the Si substrate in a shorter time, and the quality can be improved.

The present invention is not limited to the above-described embodiments, and it is clear that many modifications and combinations can be carried out by a person of ordinary skill in the field within the technical idea of the present invention.

The invention claimed is:

1. A method for growing a rare earth oxide crystal, the method comprising:
    forming an amorphous silicon oxide layer on a silicon substrate;
    forming a metal layer comprising a rare earth metal in contact with an upper surface of the amorphous silicon oxide layer, wherein forming the metal layer is performed at a first temperature in a range from 20° C. to 150° C.;
    after forming the metal layer, reacting the amorphous silicon oxide layer with the metal layer through heating at a second temperature that is a temperature at which the rare earth metal reacts with silicon oxide for oxidation to form a first crystal layer comprising the rare earth oxide crystal obtained by oxidizing the rare earth metal on the silicon substrate; and
    growing the rare earth oxide crystal on the first crystal layer to form a second crystal layer.

2. The method according to claim 1, further comprising cleaning a surface of the silicon substrate to remove impurities prior to forming the amorphous silicon oxide layer on the surface of the silicon substrate.

3. The method according to claim 2, wherein forming the amorphous silicon oxide layer comprises oxidizing the surface of the silicon substrate.

4. The method according to claim 3, wherein forming the amorphous silicon oxide layer comprises oxidizing the surface of the silicon substrate through a chemical treatment using an oxidizing agent.

5. The method according to claim 4, wherein forming the metal layer comprises forming the metal layer through a vapor deposition method.

6. The method according to claim 5, wherein growing the rare earth oxide crystal on the first crystal layer to form the second crystal layer comprises performing vapor deposition in an oxidizing atmosphere using the rare earth metal as a vapor deposition source.

7. A method for growing a rare earth oxide crystal, the method comprising:
    cleaning a surface of a substrate, the substrate comprising silicon;
    forming an amorphous silicon oxide layer on the surface of the substrate after cleaning the surface;
    depositing a metal layer comprising a rare earth metal on an upper surface of the amorphous silicon oxide layer, wherein depositing the metal layer is performed at a first temperature in a range from 20° C. to 150° C.;
    after depositing the metal layer, forming a first crystal layer comprising the rare earth oxide crystal obtained by oxidizing the rare earth metal on the substrate, wherein forming the first crystal layer is performed at a second temperature that is a temperature at which the rare earth metal reacts with silicon oxide for oxidation; and
    forming a second crystal layer by growing the rare earth oxide crystal on the first crystal layer.

8. The method according to claim 7, wherein cleaning the surface of the substrate comprises carrying out a treatment using a chemical solution.

9. The method according to claim 7, wherein forming the amorphous silicon oxide layer comprises depositing the amorphous silicon oxide layer on the surface of the substrate using a vacuum vapor deposition method or a sputtering method.

10. The method according to claim 7, wherein forming the amorphous silicon oxide layer comprises oxidizing the surface of the substrate through a chemical treatment using an oxidizing agent.

11. The method according to claim 7, wherein depositing the metal layer comprises depositing the metal layer using a vapor deposition method.

12. The method according to claim 7, wherein depositing the metal layer comprises depositing the metal layer using a sputtering method with a target comprising the rare earth metal.

13. The method according to claim 7, wherein forming the second crystal layer comprises performing vapor deposition in an oxidizing atmosphere using the rare earth metal as a vapor deposition source.

14. The method according to claim 7, wherein forming the second crystal layer is performed at a third temperature that is between the first temperature and the second temperature.

15. A method for growing a rare earth oxide crystal, the method comprising:
    forming an amorphous silicon oxide layer on a silicon substrate;
    forming a metal layer comprising a rare earth metal in contact with an upper surface of the amorphous silicon oxide layer, wherein forming the metal layer is performed in a chamber under first conditions in which a first temperature of the silicon substrate is maintained in a first range of 20° C. to 150° C.;
    after forming the metal layer, reacting the amorphous silicon oxide layer with the metal layer to form a first crystal layer comprising the rare earth oxide crystal obtained by oxidizing the rare earth metal on the silicon substrate, wherein reacting the amorphous silicon oxide layer is performed in the chamber under second conditions in which the silicon substrate is heated from the first temperature to a second temperature of 750° C. and then reduced to a third temperature that is between the first temperature and the second temperature; and
    growing the rare earth oxide crystal on the first crystal layer to form a second crystal layer, wherein growing the rare earth oxide crystal is performed in the chamber under third conditions in which the silicon substrate is maintained at the third temperature for a predetermined period of time.

* * * * *